(12) United States Patent
Tt et al.

(10) Patent No.: US 10,727,820 B2
(45) Date of Patent: Jul. 28, 2020

(54) POWER- AND AREA-EFFICIENT CLOCK DETECTOR

(71) Applicant: Advanced Micro Devices, Inc., Santa Clara, CA (US)

(72) Inventors: Hariprasad Tt, Bangalore (IN); Satish Sankaralingam, Bangalore (IN); Dinakar Venkata Sarraju, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/992,604

(22) Filed: May 30, 2018

(65) Prior Publication Data

US 2019/0372561 A1 Dec. 5, 2019

(51) Int. Cl.
*H03K 3/037* (2006.01)
(52) U.S. Cl.
CPC .................. *H03K 3/0377* (2013.01)
(58) Field of Classification Search
CPC .............. H03K 5/19; G06F 11/0757
See application file for complete search history.

(56) References Cited

U.S. PATENT DOCUMENTS

| | | | |
|---|---|---|---|
| 3,984,703 A | 10/1976 | Jorgensen | |
| 5,619,643 A * | 4/1997 | Moroni | G06F 1/04 326/101 |
| 6,215,350 B1 * | 4/2001 | Wyland | H03K 17/04106 327/374 |
| 6,218,893 B1 | 4/2001 | Noguchi | |
| 6,278,294 B1 * | 8/2001 | Taniguchi | H03K 19/0013 326/57 |
| 6,310,504 B1 * | 10/2001 | Suh | H03K 19/00323 327/262 |
| 6,356,099 B1 * | 3/2002 | Lee | H03K 3/3565 326/24 |
| 6,509,772 B1 * | 1/2003 | Ye | H03K 3/037 327/211 |
| 6,518,848 B2 | 2/2003 | Teraishi | |
| 6,597,204 B2 | 7/2003 | Imamura | |

(Continued)

OTHER PUBLICATIONS

Paul R. Gray and Robert G. Meyer; "Analysis and Design of Analog Integrated Circuits"; Excerpt of Textbook; ISBN: 0-471-87493-0; Published by John Wiley & Sons, 1984; 11 pages.

*Primary Examiner* — Thomas J. Hiltunen
(74) *Attorney, Agent, or Firm* — Polansky & Associates, P.L.L.C.; Paul J. Polansky

(57) ABSTRACT

A clock detector includes a first detector circuit, a second detector circuit, and a toggle detector circuit. The first detector circuit is for activating a first detect signal in response to detecting that a clock signal that toggles between first and second logic states when present is stuck in the first logic state, and keeping the first detect signal inactive otherwise. The second detector circuit is for providing a second detect signal in response to detecting that the clock signal is stuck in the second logic state, and keeping the second detect signal inactive otherwise. The toggle detector circuit is for activating a toggle detect signal in response to both the first detect signal and the second detect signal being inactive, and keeping the toggle detect signal inactive in response to an activation of either the first detect signal or the second detect signal.

20 Claims, 3 Drawing Sheets

(56) References Cited

U.S. PATENT DOCUMENTS

| | | | |
|---|---|---|---|
| 6,707,320 B2 | 3/2004 | Trivedi et al. | |
| 6,870,413 B1 * | 3/2005 | Chang | H03K 3/3565 |
| | | | 327/205 |
| 7,567,100 B2 | 7/2009 | Jing | |
| 2004/0205367 A1 | 10/2004 | Keithley et al. | |
| 2007/0152716 A1 | 7/2007 | Kuo et al. | |
| 2008/0001637 A1 | 1/2008 | Chen et al. | |
| 2008/0079463 A1 | 4/2008 | Wadhwa et al. | |
| 2008/0186057 A1 * | 8/2008 | Daijiro | G01R 23/15 |
| | | | 326/73 |
| 2010/0231264 A1 | 9/2010 | Wang et al. | |
| 2015/0168460 A1 * | 6/2015 | Kim | H03K 5/2481 |
| | | | 327/77 |

* cited by examiner

POWER- AND AREA-EFFICIENT CLOCK DETECTOR

BACKGROUND

A clock detection circuit is a circuit that detects whether a periodic clock signal is present, i.e. whether it is toggling or not. For example, a phase locked loop (PLL) may lose its reference clock input. To detect the presence or absence of such a clock signal, both analog and digital approaches are known. The analog approach relies on analog circuits that consume a relatively large amount of circuit area and require a precise reference voltage for accurate detection. One known digital alternative requires an auxiliary oscillator to establish a time window in which to check for clock transitions. While the digital approach reduces the required circuit area, an auxiliary oscillator may not always be available.

Figure 1:
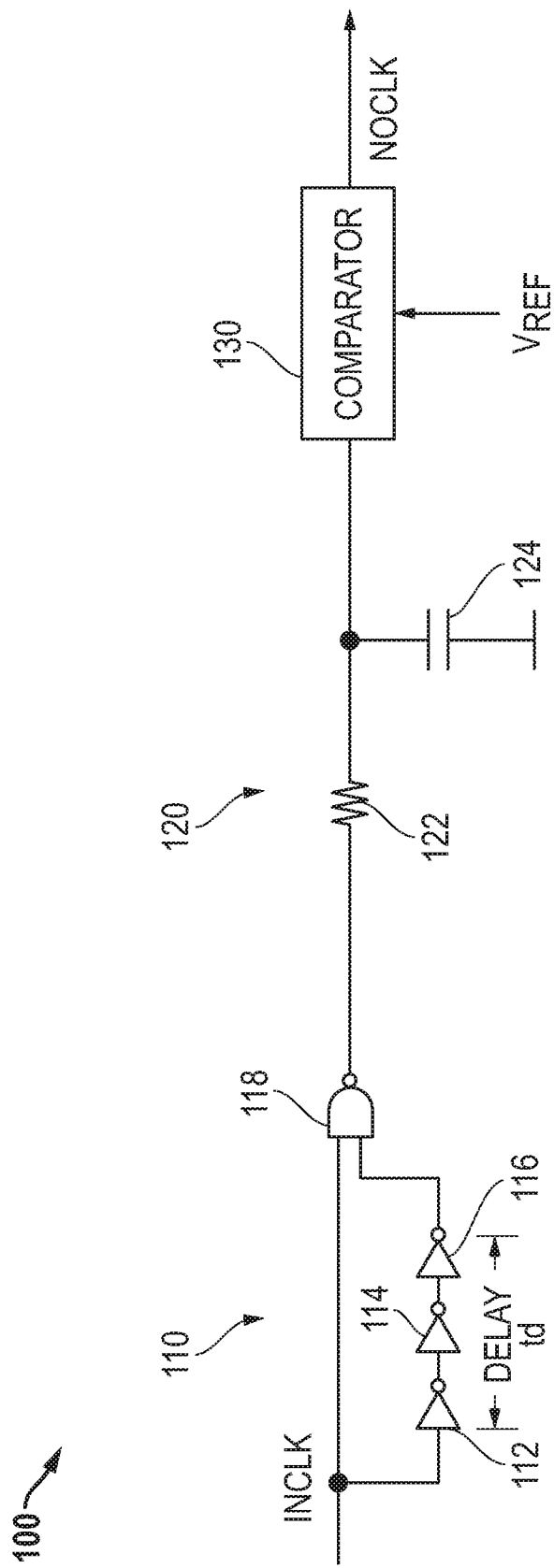
FIG. 1 illustrates in partial block diagram and partial schematic form a clock detection circuit known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Additionally, the terms remap and migrate, and variations thereof, are utilized interchangeably as a descriptive term for relocating.

DETAILED DESCRIPTION OF ILLUSTRATIVE EMBODIMENTS

As will be described in detail below, in one form, a clock detector includes a first detector circuit, a second detector circuit, and a toggle detector circuit. The first detector circuit is for activating a first detect signal in response to detecting that a clock signal that toggles between first and second logic states when present is stuck in the first logic state, and keeping the first detect signal inactive otherwise. The second detector circuit is for providing a second detect signal in response to detecting that the clock signal is stuck in the second logic state, and keeping the second detect signal inactive otherwise. The toggle detector circuit is for activating a toggle detect signal in response to both the first detect signal and the second detect signal being inactive, and keeping the toggle detect signal inactive in response to an activation of either the first detect signal or the second detect signal.

In another form, a clock detector circuit includes a first logic state detector circuit, a second logic state detector circuit, and a toggle detector circuit. The first logic state detector circuit has an input for receiving a clock signal that toggles between first and second logic states when present, and remaining at one of the first and second logic states if absent, and an output provided at a first output node. The first logic state detector circuit charges the first output node at a first rate in response to the clock signal being at the second logic state, and discharges the first output node at a second rate smaller than the first rate in response to the clock signal being in the first logic state. The second logic state detector circuit has an input for receiving the clock signal, and an output provided at a second output node. The second logic state detector circuit charges the second output node at the first rate in response to the clock signal being in the first logic state, and discharges the second output node at the second rate in response to the clock signal being in the second logic state. The toggle detector circuit is for providing a toggle detect signal in the first logic state in response to both the first output node and the second output node having voltages corresponding to the second logic state, and providing the toggle detect signal in the second logic state in response to either the first output node or the second output node having a voltage corresponding to the first logic state.

In yet another form, a method includes coupling a first terminal of a first capacitor to a first reference voltage through a first impedance in response to a clock signal that toggles between first and second logic states when present being in the second logic state. The first terminal of the first capacitor is coupled to a second reference voltage at a second impedance larger than the first impedance in response to the clock signal being in the first logic state. A first terminal of a second capacitor is coupled to the first reference voltage through a third impedance in response to the clock signal being in the first logic state. The first terminal of the second capacitor is coupled to the second reference voltage at a fourth impedance higher than the third impedance in response to the clock signal being in a second logic state. A toggle detect signal is activated in response to both the first terminal of the first capacitor and the first terminal of the second capacitor being at a logic state corresponding to the first reference voltage. The toggle detect signal is kept inactive in response to one of the first terminal of the first capacitor and the first terminal of the second capacitor being at a logic state corresponding to the second reference voltage.

FIG. 1 illustrates in partial block diagram and partial schematic form a clock detection circuit 100 known in the prior art. Clock detection circuit 100 includes generally a transition detector 110, an RC filter 120, and a comparator 130. Transition detector 110 includes inverters 112, 114, and 116, and a NAND gate 118. Inverter 112 has an input for receiving a clock signal labeled "INCLK", and an output. Inverter 114 has an input connected to the output of inverter 112, and an output. Inverter 116 has an input connected to the output of inverter 114, and an output. NAND gate 118 has a first input for receiving the INCLK signal, a second input connected to the output of inverter 116, and an output. RC filter 120 includes a resistor 122 and a capacitor 124. Resistor 122 has a first terminal connected to the output terminal of NAND gate 118, and a second terminal. Capacitor 124 has a first terminal connected to the second terminal of resistor 122, and a second terminal connected to ground. Comparator 130 has a positive input connected to the second terminal of resistor 122 and the first terminal of capacitor 124, a negative for receiving a reference voltage labeled "VREF", and an output for providing a signal labeled "NOCLK".

Transition detector 110 detects a low-to-high transition of INCLK and provides a pulse at the output of NAND gate 118 in response. When INCLK is at a logic low, the first input of NAND gate 118 is at a logic low and the second input of NAND gate 118 is at a logic high, since INCLK goes through three inversions in inverters 112, 114, and 116. Thus the output of NAND gate 118 is at a logic high. When INCLK transitions from a logic low to a logic high, both inputs of NAND gate 118 are momentarily at a logic high, causing NAND gate 118 to pulse low until the logic high of INCLK propagates through inverters 112, 114, and 116 to provide a logic low on the second input of NAND gate 118. The logic low causes NAND gate 118 to again provide a logic high on its output and end the low pulse at its output.

RC filter 120 provides a voltage on the first terminal of capacitor 124 based on the average voltage on the first terminal of resistor 122. Thus the delay of the inverter chain and the values of resistor 122 and capacitor 124 are set such that when INCLK is present and makes regular transitions at an expected frequency, RC filter 120 pulls the voltage at the first input of comparator 130 below VREF to cause comparator 130 to keep signal NOCLK inactive. If INCLK is not present, it does not make regular low-to-high transitions, and NAND gate 118 will provide a continuous logic high voltage on the output thereof and eventually bring the first terminal of capacitor 124 above VREF, which causes comparator 130 to activate NOCLK at a logic high.

While clock detection circuit 100 reliably detects the presence or absence of INCLK, it requires a large amount of circuit area to implement comparator 130. Moreover it requires a reference voltage generator circuit that can generate VREF at a precise enough voltage to detect the presence of INCLK in the desired frequency range.

Figure 2:
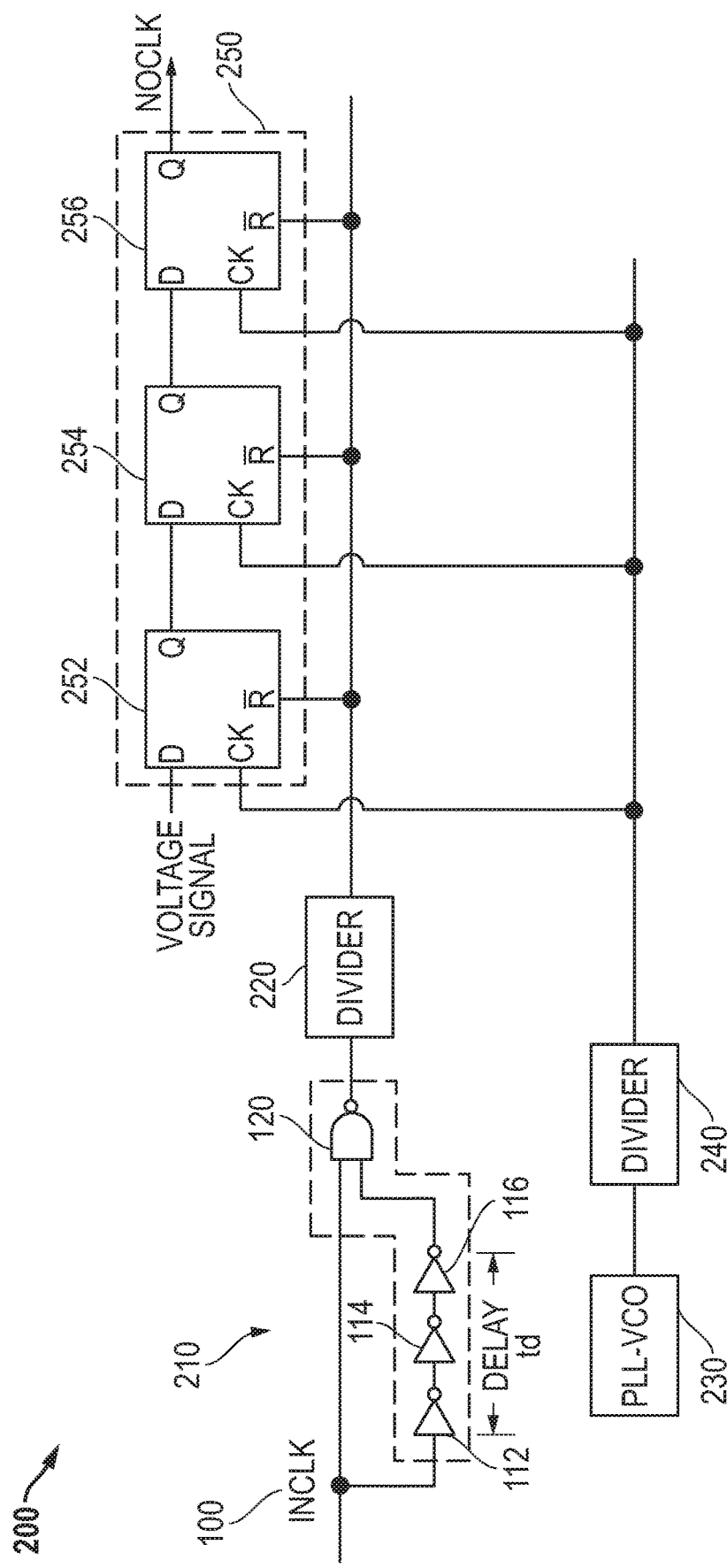
FIG. 2 illustrates in partial block diagram and partial schematic form another clock detection circuit known in the prior art.

FIG. 2 illustrates in partial block diagram and partial schematic form another clock detection circuit 200 known in the prior art. Clock detection circuit 200 includes generally a transition detector 210, a divider 220, a phase locked loop-voltage controlled oscillator (PLL-VCO) 230, a divider 240, and a timer 250.

Transition detector 210 is constructed the same as transition detector 110 of FIG. 1. Divider 220 has an input connected to the output of transition detector 210, and an output. PLL-VCO 230 has an output for providing a reference clock signal. Divider 240 has an input connected to the output of PLL-VCO 230, and an output. Timer 250 includes flip-flops 252, 254, and 256. Flip-flip 252 is a D-type flip flop having a D input for receiving a signal labeled "VOLTAGE SIGNAL", a clock (CK) input connected to the output of divider 240, an active low reset input labeled R connected to the output of divider 220, and a Q output. Flip-flip 254 is a D-type flip flop having a D input connected to the output of flip-flop 252, a clock (CK) input connected to the output of divider 240, an active low reset input labeled R connected to the output of divider 220, and a Q output. Flip-flip 256 is a D-type flip flop having a D input connected to the output of flip-flop 254, a clock (CK) input connected to the output of divider 240, an active low reset input labeled R connected to the output of divider 220, and a Q output for providing the NOCLK signal.

Transition detector again provides narrow, low pulses in response to low-to-high transitions of the INCLK signal. Divider 220 outputs a low pulse in response to detecting a certain number of low-to-high transitions in the INCLK signal as indicated by transition detector 210. In the presence of the INCLK signal, divider 220 outputs a low pulse every M low pulses at the output of divider 220. The low pulses reset the flip-flops making up timer chain 250. If divider 220 does not provide a low pulse within N+1 clock pulses of the reference clock, then timer 250 outputs the NOCLK signal at a logic high.

While clock detection circuit 200 is an all-digital approach, it requires the availability of an auxiliary clock source as as PLL-VCO 230. In systems without such an auxiliary clock source, however, clock detection circuit 200 is not feasible because it would require the construction of an accurate oscillator circuit that would consume more area than clock detection circuit 100 of FIG. 1.

Figure 3:
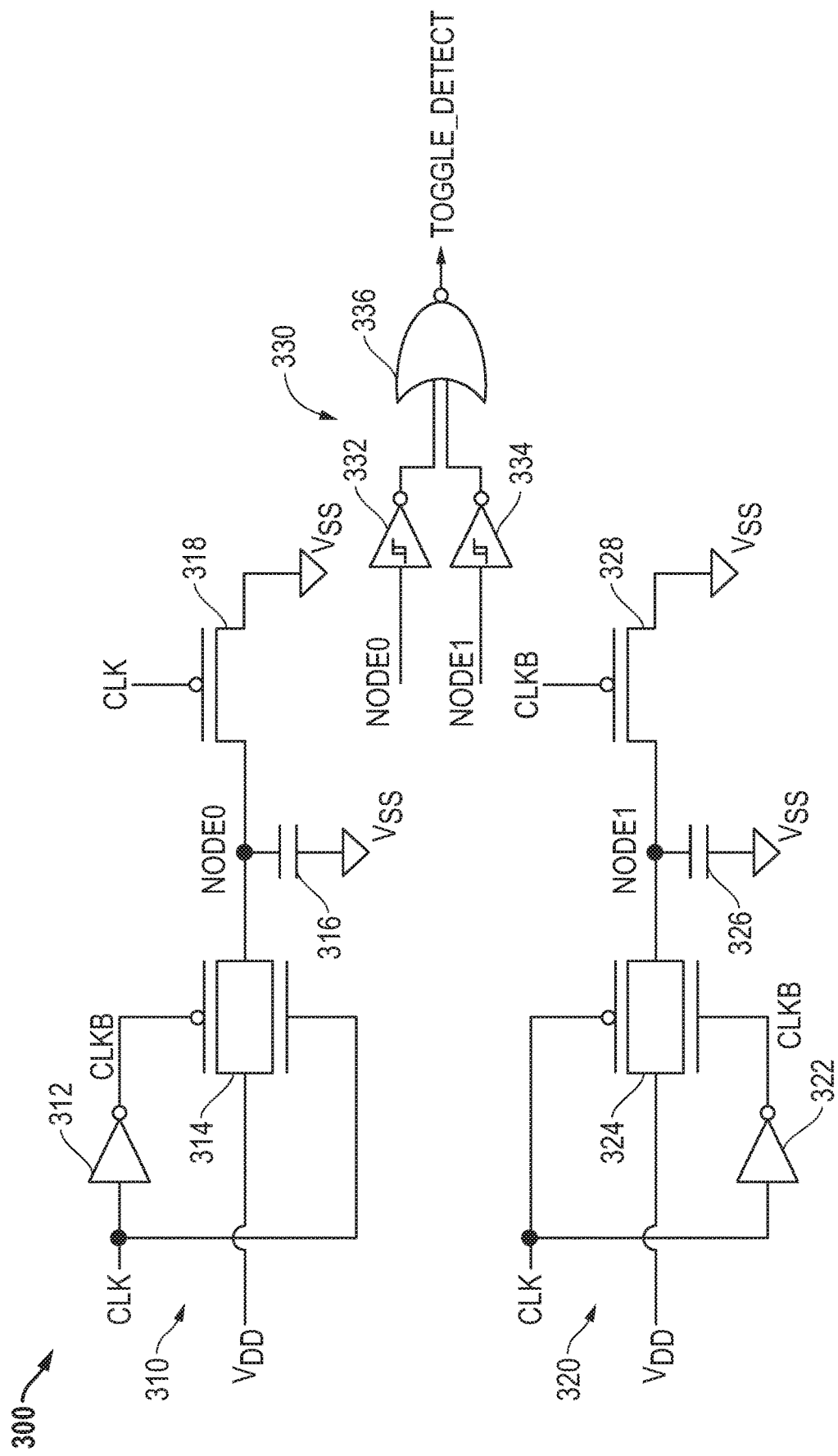
FIG. 3 illustrates in partial block diagram and partial schematic form a clock detector according to various embodiments.

FIG. 3 illustrates in partial block diagram and partial schematic form a clock detector 300 according to various embodiments. Clock detector 300 includes generally a detector circuit 310, a detector circuit 320, and a toggle detection circuit 330.

Detector circuit 310 includes an inverter 312, a transmission gate 314, a capacitor 316, and a transistor 318. Inverter 312 has an input for receiving a clock signal labeled "CLK", and an output for providing an inverted clock signal labeled "CLKB". Transmission gate 314 is a complementary metal-oxide-semiconductor (CMOS) transmission gate having an input connected to a power supply voltage terminal labeled "$V_{DD}$", an output connected to a node labeled "NODE0", an N-channel transistor gate terminal for receiving the CLK signal, and a P-channel transistor gate terminal connected to the output of inverter 312 for receiving the CLKB signal. Capacitor 316 has a first terminal coupled NODE0, and a second terminal connected to ground. Transistor 318 is a P-channel transistor having a source connected to NODE0, a gate for receiving the CLK signal, and a drain connected to ground.

Detector circuit 320 includes an inverter 322, a transmission gate 324, a capacitor 326, and a transistor 328. Inverter 322 has an input for receiving the CLK signal, and an output for providing inverted clock signal CLKB. Transmission gate 324 is a CMOS transmission gate having an input connected to $V_{DD}$, an output connected to a node labeled "NODE1", an N-channel transistor gate terminal connected to the output of inverter 322 for receiving the CLKB signal, and a P-channel transistor gate terminal for receiving the CLKB signal. Capacitor 326 has a first terminal coupled NODE1, and a second terminal connected to ground. Transistor 328 is a P-channel transistor having a source connected to NODE1, a gate for receiving the CLK signal, and a drain connected to ground.

Toggle detection circuit 330 includes a Schmitt trigger 332, a Schmitt trigger 334, and a NOR gate 336. Schmitt trigger 332 has an input connected to NODE0, and an output. Schmitt trigger 334 has an input connected to NODE1, and an output. NOR gate 336 has a first input connected to the output of Schmitt trigger 332, a second input connected to the output of Schmitt trigger 334, and an output for providing a signal labeled "TOGGLE DETECT".

In operation, detector circuit 310 operates as a logic state detector for a logic low state. In other words, detector circuit 310 detects a "stuck-at-low" condition. Detector circuit 310 provides a high voltage on NODE0 if the CLK signal is present and toggling, but provides a low voltage if the CLK signal is stuck in a logic low state. When the CLK signal is present and toggling, NODE0 is alternately charged through transmission gate 314, and discharged through transistor 318. Transmission gate 314 is active when CLK is high. When active, transmission gate 314 has relatively low ON resistance to $V_{DD}$. The P- and N-channel transistors that make up transmission gate 314 are "short-channel" devices, in which the gate width-to-gate length ratio (W/L) is high, for example much greater than 1.0. In addition as the voltage on NODE0 rises to within a threshold voltage drop of $V_{DD}$, the P-channel transistor in transmission gate 314 continues to pull up NODE0 to approximately $V_{DD}$. Transistor 318 is active when CLK is low. When active, transistor 318 has a relatively high ON resistance to ground. Transistor 318 is a "long-channel" transistor in which the gate width-to-gate length ratio is low, for example much less than 1.0. In addition, when the voltage on NODE0 drops below the threshold voltage of transistor 318, transistor 318 is biased sub-threshold and the rate of discharge slows. Thus when the CLK signal is toggling with a relatively even duty cycle, NODE0 will be pulled up close to $V_{DD}$, but when it is stuck at a logic low NODE0 will be pulled low.

Detector circuit 320 operates as a logic state detector for a logic high state. In other words, detector circuit 310 detects a "stuck-at-high" condition. Detector circuit 320 also provides a high voltage on NODE1 if the CLK signal is present and toggling, but provides a low voltage if the CLK signal is stuck in a logic high state. When the CLK signal is present and toggling, NODE1 is alternately charged through transmission gate 324, and discharged through transistor 328. Transmission gate 324 is active when CLK is low. When active, transmission gate 324 has relatively low ON resistance to $V_{DD}$ using short-channel transistors with a high W/L ratio, for example much greater than 1.0. In addition as the voltage on NODE1 rises to within a threshold voltage drop of $V_{DD}$, the P-channel transistor in transmission gate 324 continues to pull up NODE0 to approximately $V_{DD}$. Transistor 328 is active when CLK is high. When active, transistor 328 has a relatively high ON resistance to ground. Transistor 328 is a long-channel transistor with a low W/L ratio, for example much less than 1.0. In addition, when the voltage on NODE1 drops below the threshold voltage of transistor 328, transistor 328 is biased sub-threshold and the rate of discharge slows. Thus when the CLK signal is toggling with a relatively even duty cycle, NODE1 will be pulled up close to $V_{DD}$, but when it is stuck at a logic high NODE1 will be pulled low.

Schmitt triggers 332 and 334 detect logic low voltages on NODE0 and NODE1, respectively, and since they are inverting Schmitt triggers, provide logic high voltages in response. Thus if either NODE0 is low (CLK is stuck low) or NODE1 is low (CLK is stuck high), TOGGLE DETECT will be low. However if both NODE0 is high (CLK is not stuck low) and NODE1 is high (CLK is not stuck high), then TOGGLE DETECT will be high.

Clock detector 300 overcomes the deficiencies of known clock detector circuits such as clock detection circuit 100 or clock detection circuit 200. Clock detector 300 is compact, requiring only about a small number of transistors, only two of which are long-channel transistors, and two capacitors. Schmitt triggers 332 and 334 can be implemented with a variety of well-known CMOS Schmitt triggers, such as the Schmitt trigger disclosed in U.S. Pat. No. 3,984,703. Moreover clock detector 300 does not require a comparator or any other precision analog circuits. It also does not require any reference voltages or auxiliary clock source. Thus only a very small area is needed to implement clock detector 300 when modern integrated circuit manufacturing technology.

Clock detector 300 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, some embodiments can use non-inverting Schmitt triggers with a NAND gate to provide an active-low TOGGLE DETECT SIGNAL. The output of NOR gate 336 can be inverted to provide a NOCLK signal that is a logic high in the absence of a clock signal. Moreover in other embodiments, other detector circuits that detect whether a signal is stuck in a given logic state may be used.

Accordingly, it is intended by the appended claims to cover all modifications of the disclosed embodiments that fall within the scope of the disclosed embodiments.

What is claimed is:

1. A clock detector comprising:
    a first detector circuit for activating a first detect signal in response to detecting that a clock signal that toggles between first and second logic states when present is stuck in said first logic state, and keeping said first detect signal inactive otherwise;
    a second detector circuit for providing a second detect signal in response to detecting that said clock signal is stuck in said second logic state, and keeping said second detect signal inactive otherwise; and
    a toggle detector circuit for activating a toggle detect signal in response to both said first detect signal and said second detect signal being inactive, and keeping said toggle detect signal inactive in response to an activation of either said first detect signal or said second detect signal,
    wherein each of said first detector circuit and said second detector circuit comprises:
        a capacitor having a first terminal coupled to an output node that provides a corresponding detect signal, and a second terminal coupled to a first power supply voltage terminal;
        a first switch for coupling a first reference voltage associated with a second power supply voltage terminal to said first terminal of said capacitor through a first impedance in response to said clock signal being in a first corresponding logic state; and
        a metal-oxide-semiconductor (MOS) transistor for coupling said first terminal of said capacitor to said first power supply voltage terminal through a second impedance in response to said clock signal being in a second corresponding logic state, said MOS transistor having a source directly connected to said first terminal of said capacitor, and a drain directly connected to said first supply voltage terminal, wherein said MOS transistor slows a rate of discharge of said capacitor when a voltage difference between said output node and a voltage of a gate of said MOS transistor drops below a threshold voltage of said MOS transistor.

2. The clock detector of claim 1, wherein:
    said first logic state is a logic low state and said second logic state is a logic high state;
    said first detector circuit activates said first detect signal if said clock signal is stuck in said logic low state; and said second detector circuit activates said second detect signal if said clock signal is stuck in said logic high state.

3. The clock detector of claim 2, wherein:
said first power supply voltage terminal is a ground terminal;
said second power supply voltage terminal provides a voltage that is positive with respect to said ground terminal; and
said MOS transistor is a P-channel MOS transistor.

4. The clock detector of claim 1, wherein said first switch comprises a complementary metal-oxide-semiconductor (CMOS) transmission gate.

5. The clock detector of claim 1, wherein said second impedance is larger than said first impedance.

6. The clock detector of claim 1, wherein said toggle detector circuit comprises:
a first hysteresis buffer having an input for receiving said first detect signal; and an output;
a second hysteresis buffer having an input for receiving said second detect signal; and an output; and
a logic gate having a first input coupled to said output of said first hysteresis buffer, a second input coupled to said output of said second hysteresis buffer, and an output for providing said toggle detect signal.

7. The clock detector of claim 6, wherein each of said first hysteresis buffer and said second hysteresis buffer comprises a Schmitt trigger.

8. The clock detector of claim 6, wherein said first hysteresis buffer and said second hysteresis buffer are inverting hysteresis buffers, and said logic gate is a NOR gate.

9. A clock detector comprising:
a first logic state detector circuit having an input for receiving a clock signal that toggles between first and second logic states when present, and remaining at one of said first and second logic states if absent, and an output provided at a first output node, wherein said first logic state detector circuit charges said first output node at a first rate in response to said clock signal being at said second logic state, and discharges said first output node at a second rate smaller than said first rate in response to said clock signal being in said first logic state using a first metal-oxide-semiconductor (MOS) transistor having a source directly connected to said first output node, and a drain directly connected to a first reference voltage terminal, wherein said first MOS transistor slows a rate of discharge of said first output node when a voltage difference between said first output node and said first power supply voltage terminal drops below a threshold voltage of said first MOS transistor;
a second logic state detector circuit having an input for receiving said clock signal, and an output provided at a second output node, wherein said second logic state detector circuit charges said second output node at said first rate in response to said clock signal being in said first logic state, and discharges said second output node at said second rate in response to said clock signal being in said second logic state using a second MOS transistor having a source directly connected to said first second output node, and a drain directly connected to said first reference voltage terminal, wherein said second MOS transistor slows a rate of discharge of said second output node when a voltage difference between said second output node and said second power supply voltage terminal drops below a threshold voltage of said second MOS transistor; and a toggle detector circuit for providing a toggle detect signal in said first logic state in response to both said first output node and said second output node having voltages corresponding to said second logic state, and providing said toggle detect signal in said second logic state in response to either said first output node or said second output node having a voltage corresponding to said first logic state.

10. The clock detector of claim 9, wherein:
said first logic state is a logic low state and said second logic state is a logic high state;
said first logic state detector circuit provides said output thereof at said voltage corresponding to said first logic state if said clock signal is stuck in said logic low state; and
said second logic state detector circuit provides said output thereof at said voltage corresponding to said first logic state if said clock signal is stuck in said logic high state.

11. The clock detector of claim 10, wherein each of said first logic state detector circuit and said second logic state detector circuit comprises:
a capacitor having a first terminal coupled to an output node that provides a corresponding detect signal, and a second terminal coupled to ground;
a first switch for coupling a second reference voltage to said first terminal of said capacitor through a first impedance in response to said clock signal being in a first corresponding logic state; and
wherein a corresponding one of said first and second MOS transistors couples said first terminal of said capacitor to said first reference voltage terminal through a second impedance larger than said first impedance in response to said clock signal being in a second corresponding logic state.

12. The clock detector of claim 11, wherein said first switch comprises a complementary metal-oxide-semiconductor (CMOS) transmission gate.

13. The clock detector of claim 11, wherein each of said first and second MOS transistors comprises a P-channel MOS transistor.

14. The clock detector of claim 9, wherein said toggle detector circuit comprises:
a first hysteresis buffer having an input coupled to said first output node, and an output;
a second hysteresis buffer having an input coupled to said second output node, and an output; and
a logic gate having a first input coupled to said output of said first hysteresis buffer, a second input coupled to said output of said second hysteresis buffer, and an output for providing said toggle detect signal.

15. The clock detector of claim 14, wherein each of said first hysteresis buffer and said second hysteresis buffer comprises a Schmitt trigger.

16. The clock detector of claim 14, wherein said first hysteresis buffer and said second hysteresis buffer are inverting hysteresis buffers, and said logic gate is a NOR gate.

17. A method comprising:
coupling a first terminal of a first capacitor to a first reference voltage terminal through a first impedance in response to a clock signal that toggles between first and second logic states when present being in said second logic state;
coupling said first terminal of said first capacitor to a second reference voltage terminal at a second impedance larger than said first impedance in response to said clock signal being in said first logic state, wherein coupling said first terminal of said first capacitor to said second reference voltage terminal comprises using a first metal-oxide-semiconductor (MOS) transistor having a source directly connected to said first terminal of said first capacitor, and a drain directly connected to said second reference voltage terminal;

coupling a first terminal of a second capacitor to said first reference voltage terminal through a third impedance in response to said clock signal being in said first logic state;

coupling said first terminal of said second capacitor to said second reference voltage terminal at a fourth impedance higher than said third impedance in response to said clock signal being in a second logic state, wherein coupling said first terminal of said second capacitor to said second reference voltage terminal comprises using a second MOS transistor having a source coupled to said first terminal of said second capacitor, and a drain coupled to said second reference voltage terminal;

activating a toggle detect signal in response to both said first terminal of said first capacitor and said first terminal of said second capacitor being at a logic state corresponding to said first reference voltage terminal; and keeping said toggle detect signal inactive in response to one of said first terminal of said first capacitor and said first terminal of said second capacitor being at a logic state corresponding to said second reference voltage terminal.

18. The method of claim 17, wherein:

coupling said first terminal of said first capacitor to said first reference voltage terminal comprises coupling said first terminal of said first capacitor to said first reference voltage terminal through a third metal-oxide-semiconductor transistor having a first effective gate length; and coupling said first terminal of said first capacitor to said second reference voltage terminal comprises coupling said first terminal of said first capacitor to said second reference voltage terminal through said first MOS transistor having a second effective gate length longer than said first effective gate length.

19. The method of claim 17, wherein said activating said toggle detect signal and said keeping said toggle detect signal inactive comprise:

detecting a first logic state on said first terminal of said first capacitor using hysteresis to provide a first detected logic state;

detecting a second logic state on said first terminal of said second capacitor using hysteresis to provide a second detected logic state; and logically combining said first and second detected logic states to form said toggle detect signal.

20. The method of claim 19, wherein:

detecting said first logic state on said first terminal of said first capacitor using hysteresis to provide said first detected logic state comprises using a first Schmitt trigger; and detecting said second logic state on said first terminal of said second capacitor using hysteresis to provide said second detected logic state comprises using a second Schmitt trigger.

\* \* \* \* \*